(12) United States Patent
Singleton et al.

(10) Patent No.: US 8,659,854 B2
(45) Date of Patent: Feb. 25, 2014

(54) MAGNETORESISTIVE SHIELD WITH STABILIZING FEATURE

(75) Inventors: Eric W. Singleton, Maple Plain, MN (US); Junjie Quan, Bloomington, MN (US); Jae-Young Yi, Prior Lake, MN (US); Shaun E. McKinlay, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/102,663

(22) Filed: May 6, 2011

(65) Prior Publication Data

US 2012/0281320 A1 Nov. 8, 2012

(51) Int. Cl.
*G11B 5/39* (2006.01)

(52) U.S. Cl.
USPC .......................................................... 360/319

(58) Field of Classification Search
USPC .......................................................... 360/319
See application file for complete search history.

(56) References Cited

U.S. PATENT DOCUMENTS

| | | | |
|---|---|---|---|
| 5,515,221 A | 5/1996 | Gill et al. | |
| 6,597,546 B2 | 7/2003 | Gill | |
| 6,700,760 B1* | 3/2004 | Mao | 360/319 |
| 7,236,333 B2 | 6/2007 | Macken | |
| 7,606,007 B2 | 10/2009 | Gill | |
| 2007/0076331 A1* | 4/2007 | Pinarbasi | 360/324.11 |
| 2008/0253037 A1* | 10/2008 | Kagami et al. | 360/324 |
| 2009/0279213 A1 | 11/2009 | Wu et al. | |
| 2010/0232074 A1* | 9/2010 | Machita et al. | 360/324.11 |
| 2011/0051291 A1* | 3/2011 | Miyauchi et al. | 360/319 |
| 2011/0279923 A1* | 11/2011 | Miyauchi et al. | 360/319 |

* cited by examiner

*Primary Examiner* — Craig A. Renner
(74) *Attorney, Agent, or Firm* — Hall Estill Attorneys at Law (57) ABSTRACT

A magnetoresistive (MR) reader is adjacent to at least one shield that extends from an air bearing surface (ABS) a first distance. The shield has a stabilizing feature that is contactingly adjacent the MR reader and extends from the ABS a second distance that is less than the first distance.

20 Claims, 4 Drawing Sheets

FIG. 5 VIEW FROM ABS

MAGNETORESISTIVE SHIELD WITH STABILIZING FEATURE

SUMMARY

Various embodiments of the present invention are generally directed to a magnetic shield that may be capable of protecting a magnetoresistive element from unwanted magnetic flux.

In accordance with various embodiments, a magnetoresistive (MR) reader is adjacent to at least one shield that extends from an air bearing surface (ABS) a first distance. The shield has a stabilizing feature that is contactingly adjacent the MR reader and extends from the ABS a second distance that is less than the first distance.

DETAILED DESCRIPTION

The present disclosure generally relates to magnetic shields capable of protecting a magnetoresistive (MR) element from unwanted magnetic flux. As electronics devices become more sophisticated, demand for higher data capacity has placed added emphasis on the size of data written to a data storage media, which consequently results in a reduction in magnetic shield size. The smaller magnetic shields can inadvertently experience magnetic instability due to a reduced capability to fully protect the MR element from unwanted magnetic flux.

Accordingly, various embodiments of the present invention are generally directed to a magnetoresistive (MR) reader that is adjacent to at least one shield that extends from an air bearing surface (ABS) a first distance. The shield may have a stabilizing feature that is contactingly adjacent the MR reader and extends from the ABS a second distance that is less than the first distance. The concentration of the stabilizing feature about the MR reader may allow for enhanced shielding through improved magnetic flux blocking and noise cancellation.

Figures 1, 2:
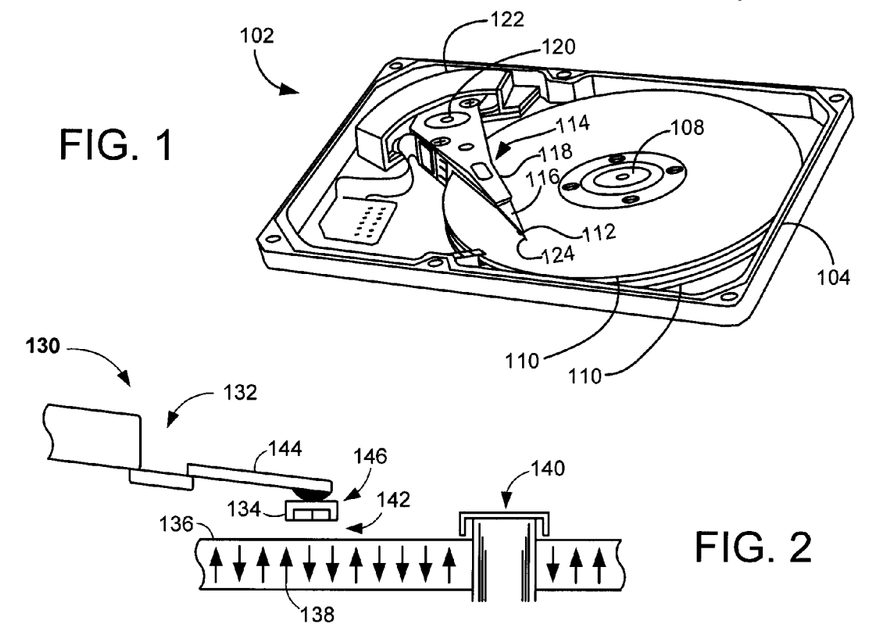
FIG. 1 generally provides of an embodiment of a data storage device.
FIG. 2 is a perspective view of an embodiment of a portion of a data storage device.

An embodiment of a data storage device 100 is provided in FIG. 1. The device 100 shows a non-limiting environment in which various embodiments of the present invention can be practiced. The device 100 includes a substantially sealed housing 102 formed from a base deck 104. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers 124 of the HGA 112 to align with tracks (not shown) defined on the media surfaces to store data thereto or retrieve data therefrom. An ability to decrease the width of the tracks while maintaining proper alignment of the transducers 124 can be accomplished by decreasing the operational width of at least one transducing magnetic element. Thus, the device 100 can have increased capacity through the incorporation of transducing elements with reduced operational width which corresponds to a finer areal resolution.

An example of a data transducing portion 130 of the data storage device 100 of FIG. 1 is displayed in FIG. 2. The transducing portion 130 has an actuating assembly 132 that positions a transducing head 134 over a magnetic storage media 136 that is capable of storing programmed bits 138. The storage media 136 is attached to a spindle motor 140 that rotates during use to produce an air bearing surface (ABS) 142 on which a slider portion 144 of the actuating assembly 132 flies to position a head gimbal assembly (HGA) 146, which includes the transducing head 134, over a predetermined portion of the media 136.

The transducing head 134 can include one or more transducing elements, such as a magnetic writer and magnetically responsive reader, which operate to program and read data from the storage media 136, respectively. In this way, controlled motion of the actuating assembly 132 causes the transducers to align with tracks (not shown) defined on the storage media surfaces to write, read, and rewrite data.

Figure 3:
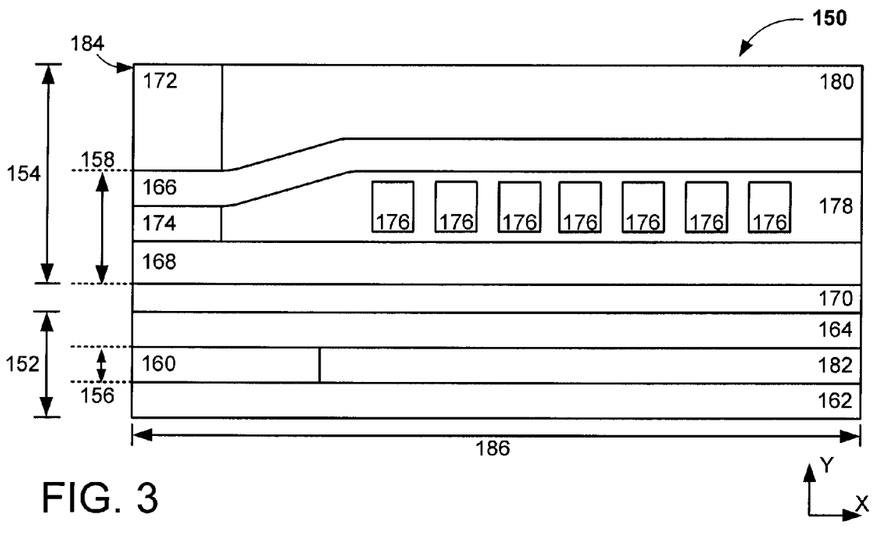
FIG. 3 generally illustrates an embodiment of a magnetic element capable of being used in the portion of the data storage device displayed in FIG. 2.

FIG. 3 displays an example of a cross-sectional block representation of a transducing head 150 that is capable of being used in the actuating assembly of FIG. 2. The head 150 can have one or more magnetic elements, such as the magnetic reader 152 and writer 154, which can operate individually or concurrently to write data to or retrieve data from an adjacent storage media, such as media 136 of FIG. 2. Each magnetic element 152 and 154 is constructed with multiple magnetic shields and transducing elements that independently define predetermined and separated read and write track 156 and 158.

As displayed, the magnetic reading element 152 has a magnetoresistive reader layer 160 disposed between leading and trailing shields 162 and 164. Meanwhile, the writing element 154 has a write pole 166 and a return pole 168 that create a writing circuit to impart a predetermined magnetic orientation to the adjacent storage media. The return pole 168 is separated from the read element 152 by a gap layer 170 of non-magnetic material while the write pole 166 is disposed between a downtrack shield 172 and an uptrack shield 174 that maintains separation of the write and return poles 166 and 168.

The writing element 154 further includes a coil 176 that can be one or many individual wires capable of imparting a magnetic flux on the write pole 166 to travel through the write circuit that concludes at the return pole 168. Additional insulating layers 178, 180, and 182 respectively surround the coil 176, write pole 166, and MR reader layer 160 to prevent leakage of magnetic flux within the transducing head 150.

The various shields and insulating materials about each magnetic element 152 and 154 provide similar focusing of magnetic fields, but the shields on the ABS 184 are configured to focus magnetic fields within the predetermined tracks 156 and 158. That is, the insulating materials 178 and 180 focus magnetic fields on the write pole 166 while the shields 162, 164, and 172 each prevent the migration of magnetic fields outside the predetermined tracks 156 and 158.

The shields of the transducing head 150 can be characterized by their position with respect to the timing of encountering external bits, such as bits 138 of FIG. 2. In other words, the shields that encounter the external bits before the transducing elements 152 and 154 are "leading" shields while shields that see the bits after the transducing elements are "trailing" shields. Such characterization extends to the difference between "upstream" or "downstream" of the transducing elements in that, depending on the direction of travel for the head 150 and external bits, the shields can be either leading or trailing and either upstream or downstream.

The transducing head 150, and each of the respective layers, has a predetermined thickness measured along a Y plane, and a stripe height 186 measured along an X plane. With respect to the shields 162, 164, and 172, the respective shape and dimensions do not vary along the stripe height 186. As such, each shield maintains a predetermined thickness throughout the extent of each shield's stripe height.

With the track width 158 getting smaller to allow more densely programmed bits on a storage media, more precise definition of the track 158 corresponds to a minimized head 150. The smaller transducing head 150 consequently is more sensitive to unwanted magnetic fields from adjacent tracks. The reduced head 150 topography can further introduce magnetic instability through magnetic domain movement in the magnetic shields due to shield domain proximity to the MR sensor element. Accordingly, portions of the shields 162 and 164 surrounding the MR element 160 can be configured with magnetic stabilizing features that better focus magnetic flux and more precisely define tracks 156 and 158, as generally illustrated in FIG. 4.

Figure 4A:
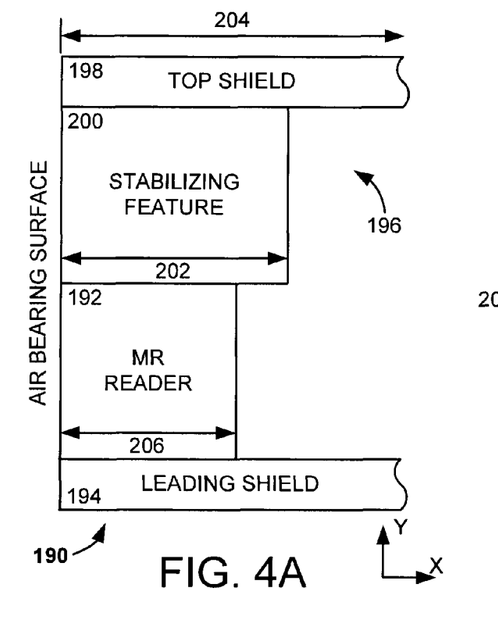
FIGS. 4A and 4B show block representations of an embodiment of a magnetic reader capable of being used in the magnetic element of FIG. 3.
Figure 4B:
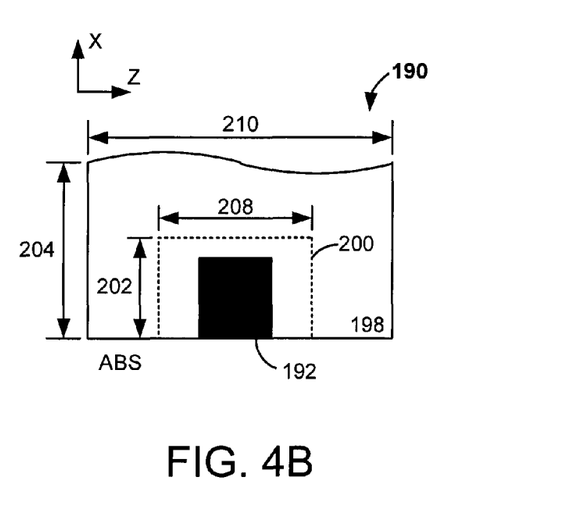

FIGS. 4A and 4B generally illustrate block representations of an embodiment of an MR element 190 from various angles. In FIG. 4A, a cross-sectional view of the MR element 190 in which an MR reader 192 is disposed between a leading shield 194 and a trailing shield 196. The trailing shield 196 is composed of both a top shield 198 and a stabilizing feature 200. The top shield 198 passively blocks unwanted magnetic flux due to material composition and orientation in the MR element 190. Meanwhile, the stabilizing feature 200 actively shields magnetic flux from reaching the MR reader 192 and reduces magnetic instability by being set to a predetermined magnetization which is maintained despite encountering unwanted magnetic flux.

The combination of active and passive shielding in the trailing shield 196 provides enhanced shield stability due to the presence of both bias and un-biased shield layers. Specifically, the magnetization of the stabilizing feature 200 reduces magnetic domain movement in response to encountered magnetic flux and acts to cancel magnetic noise. The stabilizing feature 200 further is configured with a predetermined depth 202, as measured from the air bearing surface (ABS), that minimally extends to cover the underlying MR reader 192 so that the set magnetization of the stabilizing feature 200 is strong and capable of blocking large amounts of magnetic flux.

As shown, the stabilizing feature 200 has a depth 202 that is less than the depth 204 of the top shield 198 but more than the depth 206 of the MR reader 192. This configuration is merely illustrative and not limiting, but shows that the top shield 198 and stabilizing feature 200 have distinctly different depths from the ABS that contribute to different shielding characteristics. Such varying shielding characteristics can operate in concert to stabilize magnetic orientation and effectively shield unwanted magnetic flux and noise from effecting the operation of the MR reader 192.

In some embodiments, the stabilizing feature 200 has a depth that matches the depth of the MR reader 192 in order to further concentrate the set magnetization and aid in stabilizing magnetic domains. FIG. 4B displays the various depths, as well as widths, of the components of the magnetic element 190 in the form of a top plan view. The MR reader 192 is centrally positioned about both the stabilizing feature 200 and top shield 198. The stabilizing feature 200 has a width 208 that covers the MR reader 192, but is smaller than the width 210 of the top shield 198. Such a configuration of the top shield 198 in relation to the stabilizing feature 200 provides complete passive shielding coverage of the magnetically active MR reader 192 and stabilizing feature 200, which improves overall shielding capability.

While the stabilizing feature 200 can be configured to match the MR reader 192 in both depth and width, the feature 200 can alternatively extend a distance past the MR reader 192. The condensed orientation of the stabilizing feature 200 about the MR reader 192, regardless of whether the feature 200 extends past the reader 192, provides a heightened level of flux blocking in direct contact with the MR reader 192. That is, the active magnetization of the stabilizing feature 200 presents a strong magnetic screen in contacting proximity to the MR reader 192, which enhances shielding stability, and efficiency and requires less feature 200 areal extent.

The benefits of the concentrated areal extent of the stabilizing feature 200 are additionally realized in the reduction in defect formation during manufacturing. Such a minimal stabilizing feature 200 allows for uniform deposition of the constituent layers of the feature 200, which corresponds to stronger magnetization retention, flux blocking, and noise cancellation.

Furthermore, the orientation of width and depth of the top shield 198 and the stabilizing feature 200 can be manipulated to conform to a predetermined aspect ratio that improves trailing shield 196 stability. One such predetermined aspect ratio is a width that is greater than the depth (i.e. W/D>1), which presents a large portion of the trailing shield 196 on the ABS. A large aspect ratio will also help to stabilize magnetic properties of stabilizing feature 200 to further reduce magnetic domain movement and noise. In contrast, an aspect ratio that is less than one will be relatively narrow on the ABS with the shielding effects of the trailing shield 196 less centralized about the MR reader 192.

Figure 5:
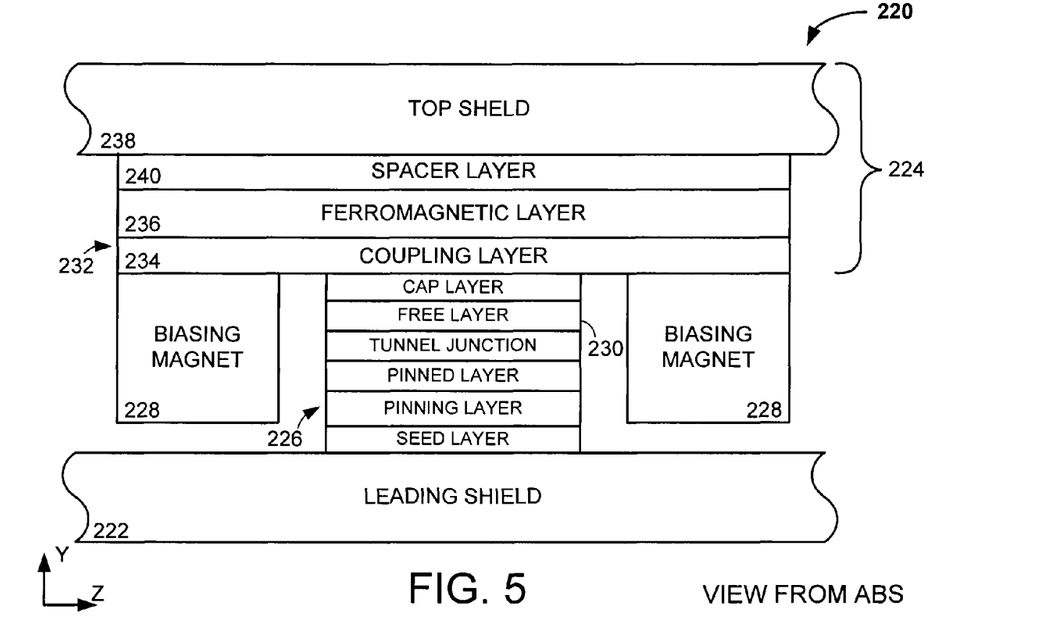
FIG. 5 illustrates a block representation of an embodiment of a shield configuration capable of being used in the magnetic reader of FIG. 4A.

By constructing the stabilizing feature 200 with a large aspect ratio, a greater portion of the feature is located on the ABS, which effectively allows for the screening of magnetic flux emanating from the rotatable storage media, such as media 136 of FIG. 2. FIG. 5 generally provides a block representation of an embodiment of a magnetic element 220 as viewed from the ABS. The element 220 has a leading and trailing shield 222 and 224 that each operate to define a predetermined track for the MR reader 226 to read data.

As displayed, the MR reader 226 can be a lamination of multiple different layers that operate in concert to be sensitive to external magnetic bit and provide a readable logical state in response to such bits. The MR reader 226 can be disposed non-contactingly adjacent to one or more biasing magnets 228 that have high coercivity and are positioned a selected distance from the MR reader 226 to provide a predetermined biasing magnetization for at least the ferromagnetic free layer 230.

The trailing shield 224 can have a variety of configurations that include at least a stabilizing feature 232 and a top shield 238. As discussed above, the stabilizing feature 232 has an areal extent that is less than the top shield 238 and is centralized about the MR reader 226. In the embodiment of FIG. 5, the stabilizing feature 232 extends laterally, along the Z axis, to match the width of the MR reader 226 and biasing magnets 228.

Industry demand for smaller magnetic elements drives for reduced shield-to-shield spacing. In an effort to minimize such spacing while providing an actively magnetized trailing shield 224 stabilizing feature 232, the hard magnetization of the biasing magnets 228 are harnessed by a coupling layer 234 of the stabilizing feature 232 to provide a predetermined magnetization to a ferromagnetic layer 236. The utilization of the biasing magnets to pin a magnetization of the ferromagnetic layer 236 eliminates a supplemental magnetization source in the stabilization feature 232, thus reducing shield-to-shield spacing of the element 220.

The stabilization feature 232 can be attached to the top shield 238 via a non-magnetic spacer layer 240 that ensures that the magnetization of the ferromagnetic layer 236 is not redirected by the top shield 238. The areal extent of the top shield 238 extends beyond the extent of the stabilization feature 232 and operates block magnetic flux distal to the MR reader 226. The passive configuration of the top shield 238 allows the predetermined magnetization of the ferromagnetic layer 236 to be efficiently positioned in close proximity to the MR reader 226 and specifically the free layer 230.

Figure 6:
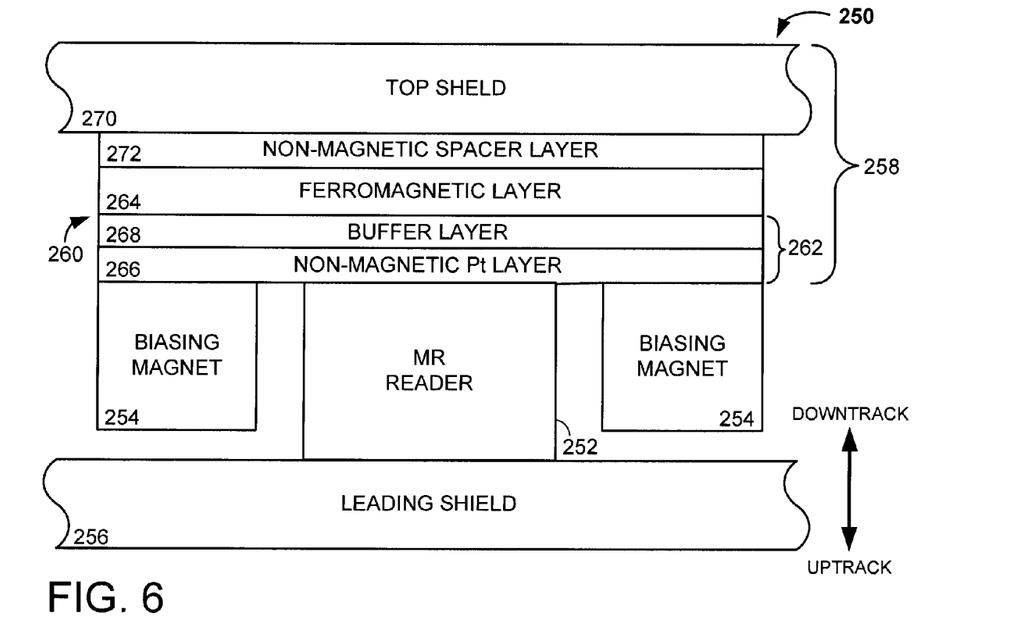
FIG. 6 displays a block representation of an embodiment of a shield configuration capable of being used in the magnetic reader of FIG. 4A.

The construction of the coupling layer 234 allows it to concurrently couple the biasing magnets 228 while decoupling the MR reader 226 so that the magnetization of the ferromagnetic layer 236 and biasing magnets 228 do not interfere with the operation of the reader 226. In some embodiments, the coupling layer 234 is a continuous and solid non-magnetic layer, such as Pt, however, such construction can be modified, in any number of non-limiting ways. FIG. 6 provides such an alternative coupling layer configuration in the context of an embodiment of a magnetic element 250 as viewed from the ABS.

In FIG. 6, the magnetic element 250 has an MR reader 252 disposed laterally between biasing magnets 254 and medially between leading and trailing shields 256 and 258. It is to be understood that the magnetic element 250 is portrayed as aligned with a predetermined track where the bottom portion of the element 250 is uptrack and will encounter a magnetic bit before a downtrack portion at the top of the element 250. As a magnetoresistive (MR) reader element 252 encounters a rotating magnetic media, the leading and trailing shields 256 and 258 protect the MR element 252 from external magnetic flux.

The susceptibility of the MR element 252 to unwanted magnetic flux can induce instability and reduced accuracy, which can be reduced by stabilizing the magnetic domains of one or more shields. FIG. 6 shows an example of adding shield stabilization feature in the trailing shield 258. Stabilizing the trailing shield 258 can be achieved with a stabilizing feature 260 that has a laminated coupling layer 262 that is contactingly adjacent to the MR reader 252, biasing magnets 254, and a ferromagnetic layer 264. The material and orientation of the coupling layer 262 concurrently decouples the MR reader 252 while coupling to the biasing magnets 254 so that the magnets 254 bias the ferromagnetic layer 264 of the trailing shield 260 to a predetermined magnetization.

The pinning of the ferromagnetic layer 264 by biasing magnets 254 with high coercivity stabilizes the trailing shield 260 by reducing magnetic domain movement and reducing noise experienced by the MR element 252 in the presence of magnetic flux. The non-magnetic layer 266 in coupling layer 262 decouples ferromagnetic layer 264 from MR element 252 and allows MR element 252 to respond independently.

With the various possible constructions of the biasing magnets 254 to provide bias magnetizations to the ferromagnetic layer 264 and the MR reader 252, a non-magnetic material, such as Pt, can be used for the coupling layer 262 when the magnets 254 are composed of CoPt, FePt, or a lamination of Pt and Fe materials. However, when ferromagnetic layer 264 is a NiFe based alloy, it can result in magnetic property degradation of magnet 254 due to intermixing between ferromagnetic layer 264 and magnet 254 if coupling layer 262 is a single Pt layer, as shown in FIG. 5. Thus, to avoid magnet property degradation, the buffer layer 268 is inserted to maintain the coupling layer's 262 ability to concurrently decouple the MR reader 252 while coupling the biasing magnets 254, but without concern for magnet property degradation.

The buffer layer 268 can be a variety of materials, such as CoFe or Fe, and orientations, such as reduced thickness as measured along the track, that differs from the rest of the stabilizing feature 260. The buffer layer 268 contacts the continuous non-magnetic Pt layer 266 and effectively pins a predetermined magnetization to the ferromagnetic layer 264. Therefore, the inclusion of the buffer layer 268 can provide added protection for the stabilizing feature 260 while protecting magnet 254.

The trailing shield 258 can further be configured with a top shield 270 that is separated from the ferromagnetic layer 264 by a non-magnetic spacer layer 272 and provides a magnetic flux boundary in addition to the actively magnetized flux boundary of the stabilizing feature 260. As shown, the top shield 270 is positioned at the rear-most surface of the trailing shield 258 and while such configuration is not limited, the top shield 270 can be constructed to dispel distal unwanted magnetic flux while the ferromagnetic layer 264 dispels unwanted magnetic flux that are proximal to the MR reader element 252.

Figure 7A:
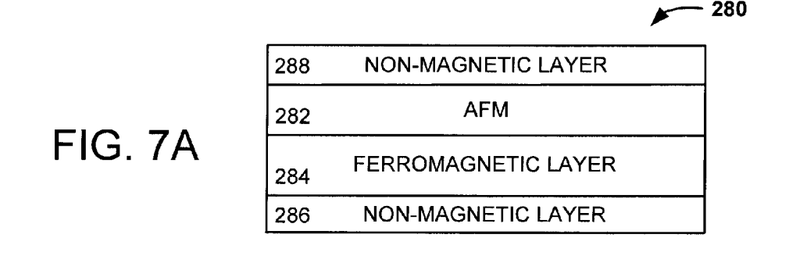
FIGS. 7A and 7B present various embodiments of a stabilizing feature capable of being used in the magnetic element of FIG. 4A.
Figure 7B:
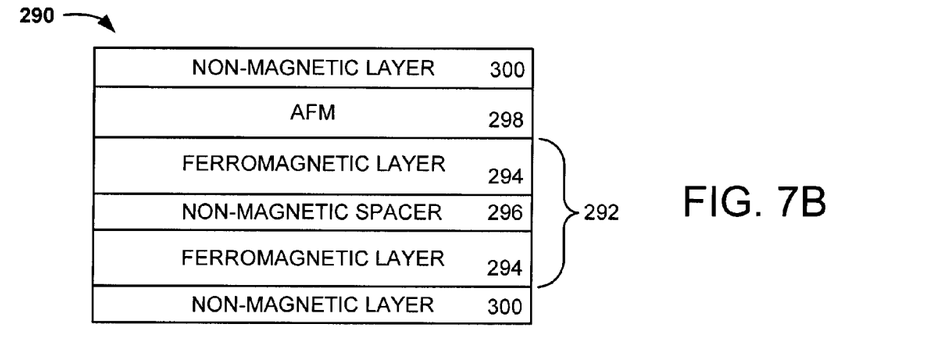

FIGS. 7A and 7B display various examples of stabilizing features 280 and 290 that can be implemented into any shield of a magnetic element. The stabilizing feature 280 of FIG. 7A has an antiferromagnetic (AFM) layer 282 coupled to a ferromagnetic layer 284 to set a predetermined magnetization in the ferromagnetic layer 284 via exchange coupling. In some embodiments, a magnetic layer, such as CoFe, is interposed between the AFM 282 and ferromagnetic layers 284 when the ferromagnetic layer 284 is a NiFe based alloy. The stabilization feature 280 further is constructed with non-magnetic layers 286 and 288 attached to the respective exterior surfaces of the ferromagnetic layer 284 and the AFM layer 282.

The use of the AFM layer 282 to set the magnetization of the ferromagnetic layer 284 instead of a biasing magnet, like in FIGS. 5 and 6, can provide an increased magnetization magnitude due to in part to greater contact area. However, fluxes from ferromagnetic layer 282 may introduce unwanted magnetic torque to the element, specifically the MR reader of FIGS. 5 and 6.

In the stabilization feature 290 of FIG. 7B, the ferromagnetic layer 284 of FIG. 7A is replaced with a synthetic antiferromagnetic (SAF) structure 292 to produce strong exchange coupling without the unwanted magnetic torque. The SAF structure 292 can be constructed of numerous different materials and configurations, one such configuration is shown in FIG. 7B which has dual ferromagnetic layers 294 attached to an interposed non-magnetic spacer 296. An AFM layer 298 provides a magnetization for the SAF 292 in a predetermined direction and magnitude that allows the SAF 292 to actively block magnetic flux and cancel noise.

A pair of non-magnetic layers 300 is attached at distal ends of the stabilization feature 290 to ensure the magnetization of the AFM 298 and SAF 292 is maintained in the feature 290 and magnetically decouple to the adjacent MR reader or passive top shield. It can be appreciated that the materials and orientation of the constituent layers of the stabilization feature 290 are not limited and can be modified to create active magnetic shielding. Those various configurations can be selectively manufactured through a predetermined fabrication routine, which is provided in FIG. 8

Figure 8:
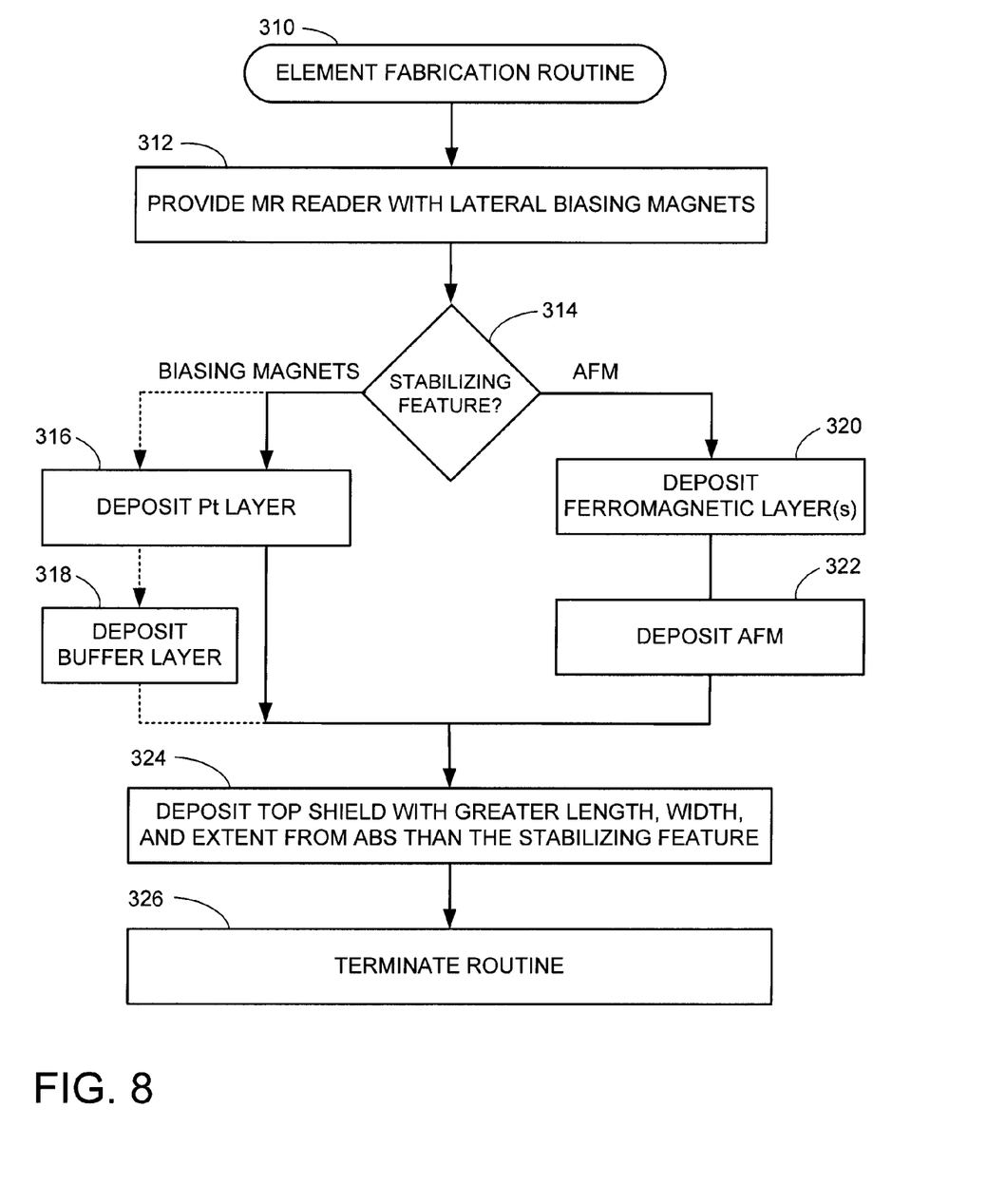
FIG. 8 provides a flowchart mapping an element fabrication routine conducted in accordance with various embodiments of the present invention.

FIG. 8 presents an embodiment of an element fabrication routine 310 conducted in accordance with various embodiments of the present invention. An MR element, such as a magnetically sensitive reader, that may be biased by lateral biasing magnets is initially provided in step 312. It can be appreciated that in providing the MR element and biasing magnets, numerous sub-steps involving the deposition of numerous laminated layers may be present to construct the biasing magnets.

The element in step 312 may also have additional external structure in combination with the MR reader and lateral hard magnets, such as an MR writer and leading magnetic shield, as shown in FIG. 3. Regardless of the external structure, the routine 310 proceeds to decision 314 where the composition of a stabilization feature that directly contacts the MR reader and biasing magnets is determined. Decision 314 evaluates various characteristics of the set magnetization of the stabilization feature, such as strength, direction, and configuration.

If the biasing magnets are chosen to stabilize the magnetic direction of the stabilization feature, the routine proceeds to step 316 where a continuous layer of Pt is deposited in contacting adjacency to the MR reader. Optionally, step 318 deposits a buffer layer on top of the MR reader and the Pt layer if the ferromagnetic layer of the stabilization feature is designed to be a Ni based alloy, which can result in hard magnet property degradation during manufacturing. Thus, the presence of Ni in the ferromagnetic layer of the stabilization feature triggers the deposition of an intervening buffer layer in the coupling layer between the MR reader and the ferromagnetic layer, as shown in FIG. 6.

A determination in decision 314 to have an AFM provide the magnetization for the stabilization feature causes the routine 310 to proceed to step 320 where one or more ferromagnetic layers are deposited, depending on the predetermined creation of a SAF structure generally depicted in FIG. 7B. With the ferromagnetic layers in place, step 322 then attaches an AFM layer to the ferromagnetic layer, as illustrated in FIG. 7A. Step 322 can further comprise configuring the AFM with a particular thickness, size, surface roughness, and intervening magnetic layer to establish a predetermined amount of exchange coupling between the AFM and the ferromagnetic layer(s).

It should be noted that the fabrication of the stabilization feature in steps 314-322 further entails the determination of a size and areal extent in which to shield the MR reader. In some embodiments, the areal extent is greater than 1 and the size is equal to or greater than the size of the MR reader or the MR reader and biasing magnets. Subsequently in step 324, a top shield with a size, including length, width and extent from the ABS surface, that is greater than the dimensions of the stabilizing feature is deposited. The addition of the passive top shield provides the MR reader with both active and passive magnetic flux blocking that enhances shield stability and noise canceling characteristics.

Through the routine 310, a shielding configuration is determined, installed, and ultimately terminated at step 326. However, the routine is not required or limited as the various decisions and steps can be omitted, changed, and added. For example, the MR reader and biasing magnets can be composed of a lamination of different materials, with or without common thicknesses and lateral distances.

It can be appreciated that the configuration and material characteristics of the magnetic shields described in the present disclosure allows for improved magnetic reading through enhancement of the magnetic stability of the trailing shield. The utilization of a magnetically pinned stabilization feature in combination with a magnetically passive top shield provides varying flux blocking capabilities and configurations. The option of utilizing the biasing magnets or an AFM to pin the stabilization feature further allows functional alternatives that allow the magnetic element to be constructed with a range of magnetization strengths and shield-to-shield spacing. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a magnetoresistive (MR) reader adjacent to at least one shield that extends from an air bearing surface (ABS) a first distance, the MR reader extending a second distance from the ABS, the shield having a stabilizing feature contactingly adjacent the MR reader and extending from the ABS a third distance that is less than the first distance and greater than the second distance, the third distance terminating at a rectangular rear surface extending parallel to the ABS, distal the ABS.

2. The apparatus of claim 1, wherein the stabilizing feature has an areal extent that differs from the MR reader.

3. The apparatus of claim 1, wherein the shield has a shield layer that has a first areal extent and the stabilizing feature has a second areal extent that is less than the first areal extent.

4. The apparatus of claim 1, wherein a ferromagnetic layer in the stabilizing feature has a predetermined magnetization.

5. The apparatus of claim 4, wherein the ferromagnetic layer is magnetically coupled to lateral biasing magnets that provides a default magnetization to the MR reader.

6. The apparatus of claim 4, wherein the ferromagnetic layer is pinned by an antiferromagnetic layer.

7. The apparatus of claim 4, wherein the ferromagnetic layer is part of at least one synthetic antiferromagnet (SAF).

8. The apparatus of claim 1, wherein the stabilizing feature has a width and the width divided by the third distance defines an aspect ratio greater than 1.

9. The apparatus of claim 1, wherein the stabilizing feature has a first width, the MR reader has a second width, and the at least one shield has a third width, the first width being greater than the second width and smaller than the third width.

10. The apparatus of claim 1, wherein the stabilizing feature decouples the MR reader with a Pt material.

11. The apparatus of claim 8, wherein the stabilizing feature has a buffer layer contactingly adjacent and a ferromagnetic layer that prevents degradation of hard magnet properties from the ferromagnetic layer.

12. The apparatus of claim 1, wherein a coupling layer of the stabilization feature is a single continuous layer of Pt.

13. The apparatus of claim 1, wherein the stabilizing feature has a width that matches an aggregate width of the MR reader and a pair of laterally disposed biasing magnets.

14. The apparatus of claim 1, wherein the shield and stabilizing feature are configured to function in concert as a trailing shield.

15. A data storage device comprising:
a magnetoresistive (MR) reader having first and second magnetic layers separated by a tunnel junction configured on an air bearing surface (ABS) and extending a first stripe height distance perpendicular to the ABS;
a top shield configured on the ABS and extending a second stripe height distance perpendicular to the ABS; and
a stabilizing feature positioned on the ABS and coupled to both the MR reader and the top shield, the stabilizing feature having a third stripe height that is greater than the first stripe height distance and less than the second stripe height distance, the third stripe height terminating at a rectangular rear surface extending parallel to the ABS, the rear surface positioned distal the ABS.

16. The data storage device of claim 15, wherein the stabilization feature has a first areal extent, the MR reader has a second areal extent, and the top shield has a third areal extent, the first areal extent being greater than the second areal extent and less than the third areal extent.

17. A magnetic element comprising:
a magnetoresistive (MR) reader disposed between lateral biasing magnets and extending a first distance from an air bearing surface (ABS);
a stabilizing feature, with a first length, width, and second distance extending from the ABS, contactingly adjacent the MR reader and the lateral biasing magnets, the stabilizing feature set to predetermined magnetization to actively block unwanted magnetic flux; and
at least one shield layer adjacent the MR reader, with a second length, second width, and third distance from the ABS, configured to passively block an unwanted amount of magnetic flux, the second distance being greater than the first distance and less than the third distance, the second distance terminating at a rectangular rear surface extending parallel to the ABS, the rear surface positioned distal the ABS.

18. The magnetic element of claim 17, wherein the shield layer is magnetically responsive to encountered magnetic flux while the stabilizing feature maintains the predetermined magnetization in response to magnetic flux.

19. The magnetic element of claim 18, wherein the stabilizing feature comprises an antiferromagnet coupled to a synthetic antiferromagnet (SAF) comprised of first and second ferromagnetic layers separated by a non-magnetic spacer layer.

20. The magnetic element of claim 17, wherein the stabilizing feature and shield layer each c1 has a continuous thickness along both X and Z axes.

* * * * *

UNITED STATES PATENT AND TRADEMARK OFFICE
CERTIFICATE OF CORRECTION

PATENT NO.       : 8,659,854 B2                                 Page 1 of 1
APPLICATION NO.  : 13/102663
DATED            : February 25, 2014
INVENTOR(S)      : Eric W. Singleton et al.

It is certified that error appears in the above-identified patent and that said Letters Patent is hereby corrected as shown below:

In the Claims

In Col. 10, Line 31
delete "c1"

Signed and Sealed this
Seventh Day of April, 2015

Michelle K. Lee
*Director of the United States Patent and Trademark Office*